(12) United States Patent
Marshall

(10) Patent No.: US 7,391,111 B2
(45) Date of Patent: Jun. 24, 2008

(54) SYSTEMS AND METHODS FOR MAINTAINING PERFORMANCE AT A REDUCED POWER

(75) Inventor: Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 256 days.

(21) Appl. No.: 11/134,172

(22) Filed: May 20, 2005

(65) Prior Publication Data

US 2006/0263913 A1 Nov. 23, 2006

(51) Int. Cl.
*H01L 23/48* (2006.01)
(52) U.S. Cl. ..................................... 257/734
(58) Field of Classification Search ............. 438/11–17, 438/125–133, 21, 197, 230, 237, 318, 352, 438/380, 51–57, 711; 257/48, 529, 59
See application file for complete search history.

(56) References Cited

U.S. PATENT DOCUMENTS

| | | | | |
|---|---|---|---|---|
| 3,508,209 | A * | 4/1970 | Agusta et al. ................. 365/51 |
| 4,967,152 | A * | 10/1990 | Patterson .................... 324/752 |
| 5,013,396 | A * | 5/1991 | Wise et al. .................... 438/51 |
| 6,329,260 | B1 * | 12/2001 | DeJong et al. .............. 438/318 |
| 6,396,712 | B1 * | 5/2002 | Kuijk ........................ 361/767 |
| 6,476,632 | B1 | 11/2002 | La Rosa et al. |
| 2002/0190283 | A1 | 12/2002 | Seno et al. |
| 2004/0175850 | A1 * | 9/2004 | Shimizu et al. ............... 438/14 |
| 2004/0251484 | A1 | 12/2004 | Miyazaki et al. |
| 2005/0086038 | A1 | 4/2005 | Reddy et al. |
| 2006/0091385 | A1 | 5/2006 | Miar |
| 2006/0128073 | A1 * | 6/2006 | Sun et al. .................... 438/132 |

* cited by examiner

*Primary Examiner*—Michael S. Lebentritt
*Assistant Examiner*—Andre' Stevenson
(74) *Attorney, Agent, or Firm*—Frederick J. Telecky, Jr.; W. James Brady, III

(57) ABSTRACT

Systems and methods are provided for maintaining performance of an integrated circuit at a reduced power. The systems and methods employ a performance monitor that generates a signal indicative of at least one performance characteristic of at least a portion of a critical path associated with the integrated circuit. The system further comprises a supply control that adjusts a supply voltage of the integrated circuit to maintain performance at a reduced power based on the signal. A temperature adjustment component can be provided to adjust the signal to compensate for temperature offsets associated with performance of the performance monitor relative to performance of the critical path over different operating temperatures. A performance measurement of the performance monitor can be determined based on the concurrent triggering of the performance monitor and the critical path.

14 Claims, 3 Drawing Sheets

SYSTEMS AND METHODS FOR MAINTAINING PERFORMANCE AT A REDUCED POWER

TECHNICAL FIELD

The present invention relates generally to electrical circuits, and more particularly to systems and methods for maintaining performance at a reduced power.

BACKGROUND

Performance monitoring circuits are employed to model actual performance of integrated circuits. For example, a ring oscillator circuit can be fabricated on a core of an integrated circuit, such that the ring oscillator is subjected to the same processing, operating and environmental conditions of the integrated circuit. The ring oscillator output frequency can be designed to be a function of the performance of a critical path of the integrated circuit. Therefore, the output frequency of the ring oscillator will change with changes in performance of the integrated circuit. Additionally, the ring oscillator output frequency can model performance degradation of the integrated circuit, since the integrated circuit and the ring oscillator are formed from transistors, which through use degrade in performance over time.

Recently, there has been a growing demand for semiconductor chips with larger density, higher performance and increased chip functionality to meet the continued demand for portable electronic devices. This demand has been partially met with the recent advance in deep sub-micron Complimentary metal oxide semiconductor (CMOS) technology. However, there is also a continuous demand for devices that provide the increased performance but at a reduced power. Therefore, with the employment of submicron CMOS processes to provide the higher performance, it is also desirable to minimize leakage of these transistor devices to minimize power consumption. Therefore, it is important to tailor device operation so a minimum desired performance is maintained, while keeping leakage to a minimum. One method for achieving this is to model the performance of the integrated circuit to the performance of a ring oscillator, and adjusting the supply voltage of the integrated circuit to a minimum operating level to maintain the desired performance of the integrated circuit based on an output frequency of the ring oscillator.

SUMMARY

In one aspect of the present invention, a system is provided for maintaining performance of an integrated circuit at a reduced power. The system comprises a performance monitor that generates a signal indicative of at least one performance characteristic of at least a portion of a critical path associated with the integrated circuit, and a temperature adjustment component that adjusts the signal to compensate for temperature offsets associated with performance of the performance monitor relative to performance of the critical path over different operating temperatures. The system further comprises a supply control that adjusts a supply voltage of the integrated circuit to maintain performance at a reduced power based on the adjusted signal.

In another aspect of the present invention, a system is provided for maintaining performance of an integrated circuit at a reduced power. The system comprises a critical path of the integrated circuit, a monostable multivibrator that generates a pulse output in response to a trigger signal to the critical path, a delay measure component that generates a delay signal based on a time difference between the pulse output relative to the trigger signal. The delay signal is indicative of a path delay associated with at least a portion of the critical path. The system further comprises a supply control that adjusts a supply voltage of the integrated circuit to maintain performance at a reduced power based on the delay signal.

In yet another aspect of the present invention, a method is provided for maintaining performance of an integrated circuit at a reduced power. The method comprises concurrently triggering a critical path of the integrated circuit and a performance monitor that generates a signal indicative of at least one performance characteristic of at least a portion of the critical path, and determining a performance measurement of the performance monitor based on the triggering. The method further comprises adjusting the performance measurement to compensate for temperature offsets associated with performance of the performance monitor relative to performance of the critical path over different operating temperatures, and adjusting a supply voltage of the integrated circuit to maintain performance at a reduced power based on the adjusted performance measurement.

DETAILED DESCRIPTION

Systems and methods are provided for maintaining performance of an integrated circuit at a reduced power. The systems and methods employ a performance monitor that generates a signal indicative of at least one performance characteristic (e.g., operating frequency, path delay) of at least a portion of a critical path associated with the integrated circuit. The system further comprises a supply control that adjusts a supply voltage of the integrated circuit to maintain performance at a reduced power based on the signal. In one aspect of the invention, a temperature adjustment component adjusts the signal to compensate for temperature offsets associated with performance of the performance monitor relative to performance of the critical path. In another aspect of the invention, a performance measurement of the performance monitor is determined based on the concurrent triggering of the performance monitor and the critical path. A component is used herein to define a functional unit that can include one or more hardware and/or software units for performing a desired function.

Figure 1:
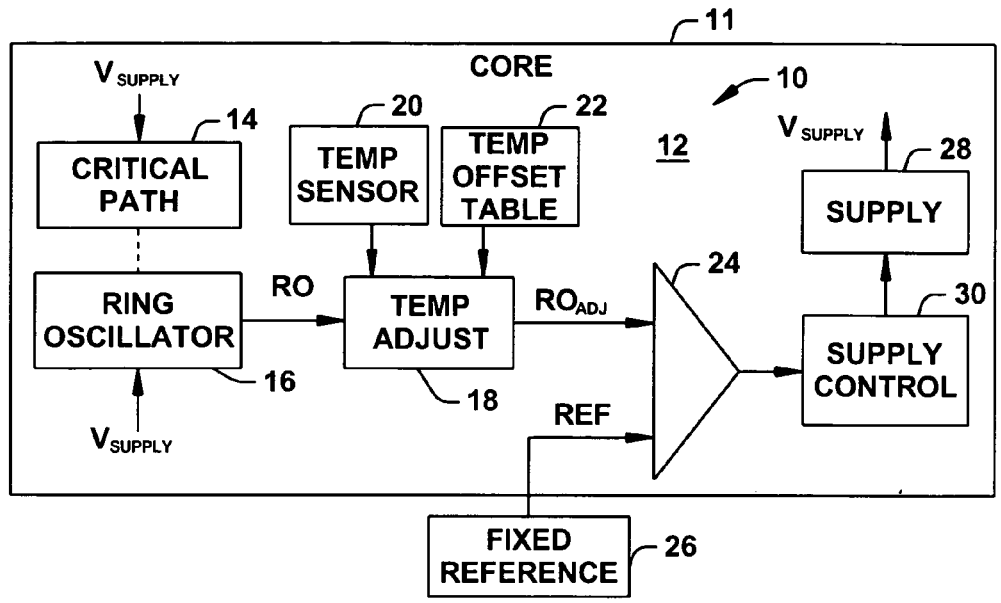
FIG. 1 illustrates a block diagram of a system for maintaining performance at a reduced power in accordance with an aspect of the present invention.

FIG. 1 illustrates a system 10 for maintaining performance at a reduced power in accordance with an aspect of the present invention. The system 10 resides on a core of an integrated circuit 11. The system 10 includes a critical path 14 associated with the functionality of the integrated circuit and a performance monitor in the form of a ring oscillator (RO) 16 that models a performance characteristic (e.g., operating frequency, path delay) of the critical path 16 of the integrated circuit 11. The critical path of an integrated circuit is typically a path in which further reduction in operating frequency or a further increase in path delay will result in the operation failure of at least a portion of the integrated circuit. A voltage supply 28 provides a supply voltage $V_{SUPPLY}$ to both the critical path 14 and the RO 16. The RO 16 generates a RO signal that has a frequency that is a function of a performance characteristic of the critical path 14. The performance characteristic of the critical path 14 can be based on the operating frequency or path delay associated with the critical path 14. The output frequency of the RO 16 can be functionally related to the operating frequency or path delay of at least a portion of the critical path. The RO signal of the RO 16 is provided to a temperature adjustment component 18.

Figure 2:
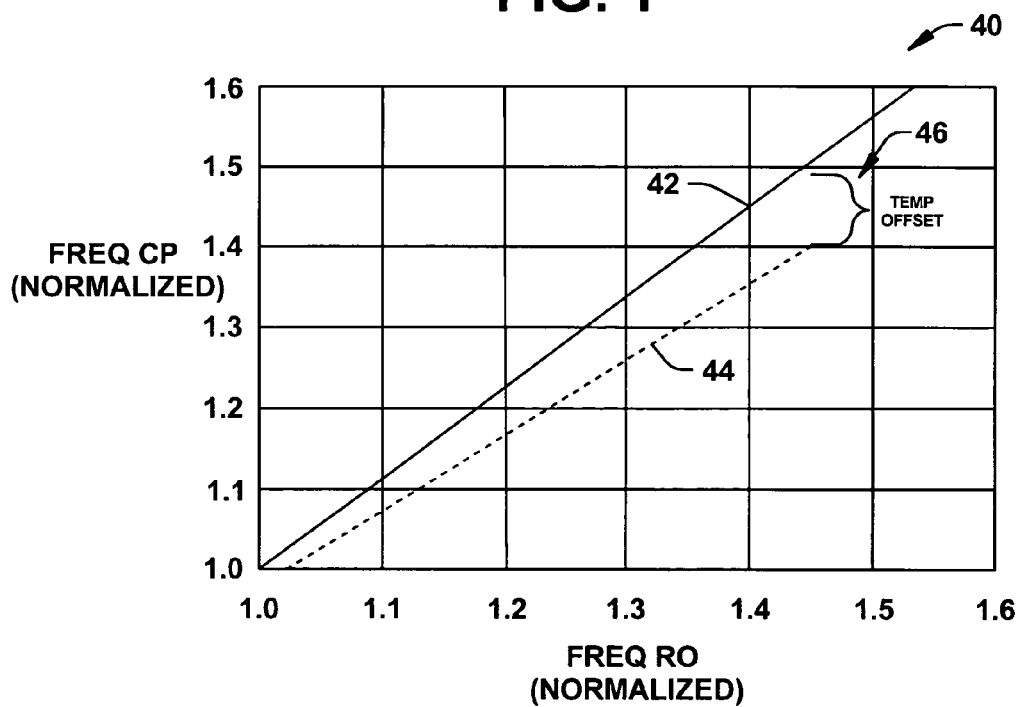
FIG. 2 illustrates a graph of critical path frequency versus ring oscillator (RO) frequency in accordance with an aspect of the present invention.

The temperature adjustment component 18 compensates for temperature offsets associated with performance of the RO 16 relative to performance of the critical path 14 over different temperatures or temperature ranges. For example, the critical path 14 can include a plurality of transistor types and interconnects that are different than the transistor types and interconnects employed in the RO 16. Therefore, the performance characteristics of the critical path device and the RO devices can vary differently over different temperatures or temperature ranges. FIG. 2 illustrates a graph 40 of critical path frequency (normalized) versus RO frequency (normalized). The graph 40 illustrates a first line 42 representing the varying frequency outputs of a critical path versus the RO frequency at different supply voltages at a first temperature at about—40° C. The graph 40 illustrates a second line 44 representing the varying frequency outputs of the critical path versus the RO frequency at different supply voltages at a second temperature at about 120° C. As illustrated in the graph 40, there is a frequency response temperature offset 46 between the frequency response of the critical path and the RO due to the temperature differences. The temperature adjustment component 18 compensates for this temperature offset.

The temperature adjustment component 18 receives a temperature reading from a temperature sensor 20 that measure the operating temperature of the core 12. The temperature adjustment component 18 then retrieves one or more temperature offset factors from a temperature offset table 22. The temperature offset table 22 includes a plurality of temperature offset factors based on a plurality of operating temperatures. The plurality of temperature offset factors can be determined at manufacturing test time and stored in a read only memory (ROM) or other permanent storage device. The temperature adjustment component 18 employs the one or more temperature offset components to adjust the RO signal to compensate for the temperature offset caused by the RO and critical path operation performance differences at varying temperatures. The temperature adjustment can be based on a single temperature factor, multiple temperature factors or an interpolated value obtained from multiple temperature factors. The temperature adjustment component 18 provides an adjusted RO signal to a comparator 24.

The comparator 24 receives the adjusted RO signal and a fixed reference signal from a fixed reference source 26. The fixed reference source 26 can reside outside the integrated circuit 11, or may be integrated into the integrated circuit 11. The fixed reference signal represents a minimum voltage level to maintain a performance level of the critical path 14 of the integrated circuit 11. The fixed reference signal can be an output frequency of a crystal oscillator, which can be compared to an output frequency of the adjusted RO signal. Alternatively, the fixed reference signal can be an output voltage of a precision voltage source, which can be compared to an adjusted output voltage of the RO signal after conversion of the RO signal from a frequency domain to a voltage domain, for example, by the temperature adjustment component 18. The comparison of the adjusted RO signal and the fixed reference signal is provided to a supply control 30. The supply control 30 adjusts the voltage level $V_{SUPPLY}$ of the supply 28 based on the comparison to maintain performance of the critical path 14 at a reduced or minimum leakage power, while still maintaining a desired performance of the critical path 14 of the integrated circuit 11.

Figure 3:
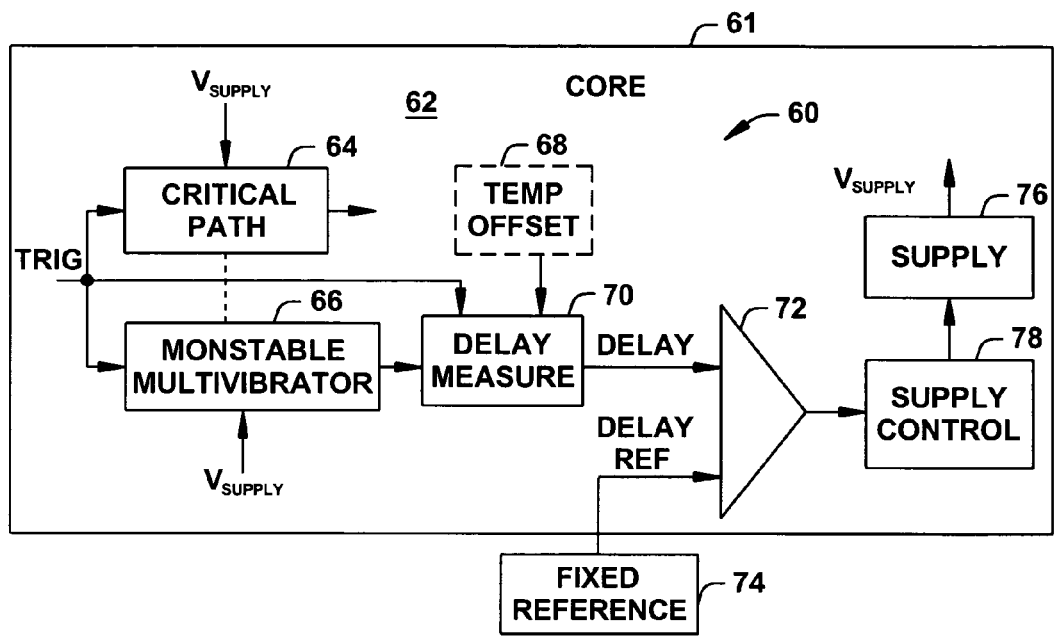
FIG. 3 illustrates a block diagram of an alternate system for maintaining performance at a reduced power in accordance with an aspect of the present invention.

FIG. 3 illustrates an alternate system 60 for maintaining performance at a reduced power in accordance with an aspect of the present invention. The system 60 resides on a core 62 of an integrated circuit 61. The system 60 includes a critical path 64 associated with the functionality of the integrated circuit 61 and a performance monitor in the form of a monostable multivibrator 66 that models a performance characteristic (e.g., operating frequency, path delay) of the critical path 64 of the integrated circuit 61. A voltage supply 76 provides a supply voltage $V_{SUPPLY}$ to both the critical path 64 and the monostable multivibrator 66. An input of the monostable multivibrator 66 is coupled to a trigger signal of the critical path 64, such that the monostable multivibrator 66 is triggered concurrently with the triggering of the critical path 64. The triggering of the monostable multivibrator 66 with the critical path 64 provides for modeling of the performance degradation of the critical path 64 due to negative bias temperature instability (NBTI), and channel hot carriers (CHC).

NBTI is a function of a negative bias being applied to a p-type metal oxide semiconductor (PMOS) transistor gate with respect to source, drain and body. This is an output logic "1" of many logic devices and is substantially a DC function. NBTI causes the transistor saturation current ($I_{DSAT}$) and transistor threshold voltage ($V_T$) to drift in the direction of a lower $I_{DSAT}$ and a higher $V_T$, which leads to lower performance and higher minimum operating conditions of the transistor. NBTI is also accelerated by high temperature and voltage. A similar but less significant problem called positive bias temperature instability (PBTI) can occur in some cases, particularly affecting transmission gates. CHC stress is a function of the switching of n-type metal oxide semiconductor (NMOS) transistor devices.

The system 60 provides for a monostable multivibrator 66 that represents the possible stress incurred by the critical path 64. The monostable multivibrator 66 includes components that simulate the operation of the critical path 64 and simulate the NBTI and CHC stress incurred by the critical path 64, which can include verifying that the switching occurs at the same frequency, delay and loading (e.g., for CHC), and the static states are the same (e.g., for NBTI). The monostable multivibrator 66 mimics the critical path loading and gates by modeling at least a portion of the active components of the critical, and executing or triggering the monostable multivibrator 66 each time the critical path 64 is executed or triggered.

Upon concurrent triggering of the critical path 64 and monostable multivibrator 66, the monostable multivibrator 66 generates a pulse signal to a delay measure component 70. The delay measure component 70 measures a time difference between the pulse output relative to the trigger signal and provides a delay signal indicative of a path delay associated with the at least a portion of the critical path to a comparator 72. The delay signal can be a scaled down version of a delay of the critical path 64 or a delay of a portion of the critical path 64. Optionally, a temperature offset system 68, such as that discussed in FIG. 1 can be employed to adjust the measured delay signal based on temperature offset. However, if the monostable multivibrator 66 closely models the critical path 64 over different operating temperatures, the temperature offset adjustment can be eliminated.

The comparator 72 receives the delay signal and a fixed delay reference signal from a fixed reference source 74. The fixed reference source 74 can reside outside the integrated circuit 61, or may be integrated into the integrated circuit 61. The fixed reference signal can provide a frequency signal, or a voltage signal that can be modified or derived into a delay signal, for example, by comparing the frequency signal to the trigger signal to generate a fixed delay reference. Alternatively, the domain of the measured delay can be converted to a frequency domain or a voltage domain to be compared to the fixed reference signal. The comparison of the measured delay signal and the fixed reference signal is provided to a supply control 78. The supply control 78 adjusts the voltage level $V_{SUPPLY}$ of the supply 76 based on the comparison to maintain performance of the critical path 64 at a reduced or minimum leakage power, while still maintaining a desired performance of the integrated circuit 61.

Figure 4:
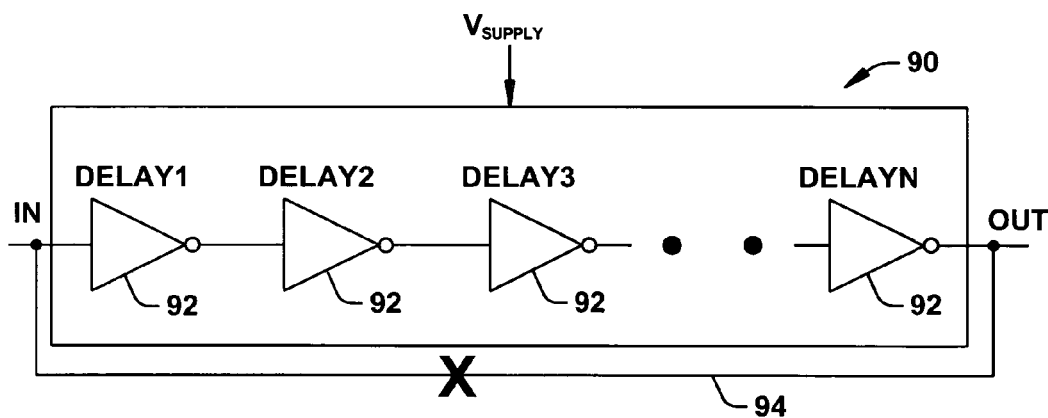
FIG. 4 illustrates an exemplary performance monitor in accordance with an aspect of the present invention.

FIG. 4 illustrates an exemplary performance monitor 90 in accordance with an aspect of the present invention. The performance monitor 90 can be configured as a ring oscillator having a plurality of series coupled inverters 92 that provide an associated delay from delay1 to delayN, where N is an odd integer greater than or equal to one. A supply voltage provides voltage $V_{SUPPLY}$ to the plurality of series coupled inverters 92. The delay elements are selected to model a performance characteristic (e.g., operating frequency, path delay) of at least a portion of the critical path of an associated integrated circuit to provide performance monitoring of the critical path of the associated integrated circuit. A feedback path 94 is provided from the output of the ring oscillator to the input of the ring oscillator to cause the ring oscillator to oscillate. The performance monitor 90 can also be configured to operate as a monostable multivibrator by removing the feedback indicated by an "X" through the feedback path 94. The inverters of the monostable multivibrator can be selected to model the delay of at least a portion of the critical path of an associated integrated circuit to provide performance monitoring of the critical path of the associated integrated circuit.

Figure 5:
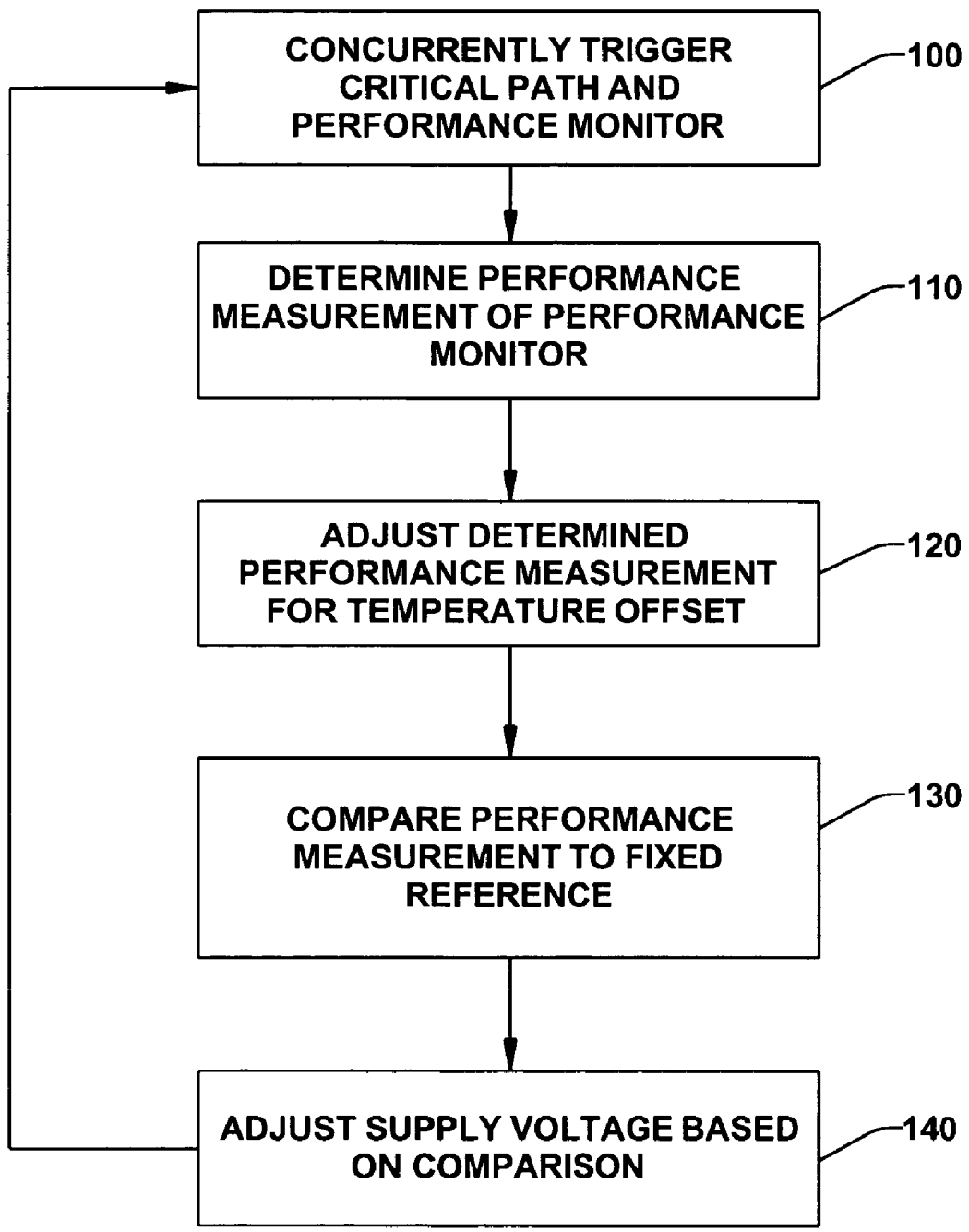
FIG. 5 illustrates a methodology for maintaining performance at a reduced power in accordance with an aspect of the present invention.

In view of the foregoing structural and functional features described above, a methodology in accordance with various aspects of the present invention will be better appreciated with reference to FIG. 5. While, for purposes of simplicity of explanation, the methodology of FIG. 5 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 5 illustrates a methodology for maintaining performance at a reduced power in accordance with an aspect of the present invention. At 100, a critical path of an integrated circuit and a performance monitor are concurrently triggered. The performance monitor can be, for example, a monostable multivibrator that includes one or more delay elements that model delay associated with at least a portion of the critical path. At 110, a performance measurement of the performance monitor is determined. The performance measurement can be a delay measurement corresponding to an the amount of delay or time difference between a pulse output of the performance monitor relative to a trigger signal. At 120, the performance measurement is adjusted for temperature offset. The temperature offset is based on different performance characteristics of the critical path relative to the performance monitor at different operating temperatures. However, if the performance monitor closely models the critical path over different operating temperatures, the temperature offset adjustment can be eliminated. The methodology then proceeds to 130.

At 130, the performance measurement is compared to a fixed reference. The fixed reference can be a fixed frequency source, such as a crystal oscillator or a precision voltage source. The fixed frequency can be compared to the trigger signal to generate a fixed delay reference. The fixed delay reference can be compared to the delay measurement of the performance monitor. Alternatively, the delay measurement can be converted to a voltage or a frequency for comparison with a fixed reference of a similar domain. At 140, the supply voltage is adjusted based on the comparison. The supply voltage is adjusted to maintain performance of the critical path at a reduced power.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. A system for maintaining performance of an integrated circuit at a reduced power, the system comprising:
   a performance monitor fabricated on a core of the integrated circuit, the performance monitor being capable of modeling at least one performance characteristic of at least a portion of a critical path associated with the integrated circuit and generating a signal indicative of the at least one modeled performance characteristic, wherein the performance of the performance monitor results in temperature offsets associated with the performance characteristic of the critical path varying differently with changes in temperature than the modeled performance characteristic;
   a temperature adjustment component that adjusts the signal to compensate for the temperature offsets; and
   a supply control that adjusts a supply voltage of the integrated circuit to maintain performance at a reduced power based on the adjusted signal.

2. The system of claim 1, wherein the performance monitor is a ring oscillator that generates a signal having a frequency that corresponds to an operating frequency of the at least a portion of the critical path.

3. The system of claim 1, further comprising a temperature offset table that maintains a plurality of temperature offset factors associated with respective operating temperatures of the integrated circuit, the temperature adjustment component employing at least one temperature offset factor to determine an adjustment to the signal from the performance monitor.

4. The system of claim 3, further comprising a temperature sensor that measures an operating temperature of the integrated circuit to the temperature adjustment offset component for selecting at least one temperature offset factor corresponding to the measured operating temperatures.

5. The system of claim 1 further comprising a comparator that compares the adjusted signal to a fixed reference signal, the fixed reference signal representing a minimum supply voltage level to maintain a desired performance level of the critical path.

6. The system of claim 5, wherein the fixed reference signal has a fixed frequency that is compared to an output frequency of the performance monitor.

7. The system of claim 5, wherein the fixed reference signal has a fixed voltage that is compared to an output voltage derived from an output frequency of the performance monitor.

8. A system for maintaining performance of an integrated circuit at a reduced power, the system comprising:
   a critical path of the integrated circuit;
   a monostable multivibrator that generates a pulse output in response to a trigger signal to the critical path, the monostable multivibrator being fabricated on a core of the integrated circuit and providing for the modeling of performance degradation of the critical path;
   a delay measure component that generates a delay signal based on a time difference between the pulse output relative to the trigger signal, the delay signal being indicative of a path delay associated with at least a portion of the critical path; and
   a supply control that adjusts a supply voltage of the integrated circuit to maintain performance at a reduced power based on the delay signal.

9. The system of claim 8, further comprising a temperature adjustment system that adjusts the delay signal to compensate for temperature offsets associated with performance of the monostable multivibrator relative to performance of the critical path over different operating temperatures.

10. The system of claim 9, further comprising a temperature offset table that maintains a plurality of temperature offset factors associated with respective operating temperatures of the integrated circuit, the temperature adjustment system employing at least one temperature offset factor to determine an adjustment to the delay signal based on a measured operating temperature.

11. The system of claim 8, further comprising a comparator that compares the delay signal to a fixed reference delay signal, the fixed reference delay signal representing a minimum supply voltage level to maintain a desired performance level of the critical path.

12. The system of claim 8, wherein the monostable multivibrator provides for modeling performance degradation of the critical path due to negative bias temperature instability and channel hot carriers.

13. A system for maintaining performance of an integrated circuit at a reduced power, the system comprising:
   a performance monitor that generates a signal indicative of at least one performance characteristic of at least a portion of a critical path associated with the integrated circuit, wherein the performance monitor is a monostable multivibrator that generates a pulse output in response to a trigger signal to the critical path, a time difference between the pulse output relative to the trigger signal providing a delay signal indicative of a path delay associated with the at least a portion of the critical path;
   a delay measure component that receives the trigger signal and the pulse output and provides the delay signal;
   a temperature adjustment component that adjusts the delay signal to compensate for temperature offsets associated with performance of the performance monitor relative to performance of the critical path over different operating temperatures; and
   a supply control that adjusts a supply voltage of the integrated circuit to maintain performance at a reduced power based on the adjusted delay signal.

14. The system of claim 13, further comprising a comparator that compares the adjusted delay signal to a fixed delay reference signal, the fixed delay reference signal representing a minimum voltage supply level to maintain a desired performance level of the critical path.

* * * * *